United States Patent
Schaller et al.

(10) Patent No.: US 8,440,579 B2
(45) Date of Patent: May 14, 2013

(54) RE-ESTABLISHING SURFACE CHARACTERISTICS OF SENSITIVE LOW-K DIELECTRICS IN MICROSTRUCTURE DEVICE BY USING AN IN SITU SURFACE MODIFICATION

(75) Inventors: Matthias Schaller, Boxdorf (DE); Daniel Fischer, Dresden (DE); Thomas Oszinda, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 102 days.

(21) Appl. No.: 13/178,587

(22) Filed: Jul. 8, 2011

(65) Prior Publication Data

US 2012/0049383 A1 Mar. 1, 2012

(30) Foreign Application Priority Data

Aug. 31, 2010 (DE) .................. 10 2010 040 071

(51) Int. Cl.
*H01L 21/31* (2006.01)
(52) U.S. Cl.
USPC ............... 438/783; 257/759; 257/E21.576; 438/623
(58) Field of Classification Search .......... 257/758, 257/759, E21.576; 438/622–624, 638, 780, 438/781, 783, 789, 790, 793, 794
See application file for complete search history.

(56) References Cited

U.S. PATENT DOCUMENTS

| | | | |
|---|---|---|---|
| 6,521,547 B1 | 2/2003 | Chang et al. | |
| 7,851,232 B2 * | 12/2010 | van Schravendijk et al. | ..... 438/4 |
| 2004/0072436 A1 | 4/2004 | RamachandraRao et al. | |
| 2004/0152296 A1 | 8/2004 | Matz et al. | |

FOREIGN PATENT DOCUMENTS

WO 2006/049595 A1 5/2006

OTHER PUBLICATIONS

Translation of Official Communication from German Patent Application No. 10 2010 040 071.8 dated Apr. 11, 2011.

* cited by examiner

*Primary Examiner* — David Vu
(74) *Attorney, Agent, or Firm* — Williams, Morgan & Amerson, P.C.

(57) ABSTRACT

Patterning-induced damage of sensitive low-k dielectric materials in semiconductors devices may be restored to a certain degree on the basis of a surface treatment that is performed prior to exposing the device to ambient atmosphere. To this end, the dangling silicon bonds of the silicon oxide-based low-k dielectric material may be saturated in a confined process environment, thereby providing superior surface conditions for the subsequent application of an appropriate repair chemistry.

17 Claims, 4 Drawing Sheets

RE-ESTABLISHING SURFACE CHARACTERISTICS OF SENSITIVE LOW-K DIELECTRICS IN MICROSTRUCTURE DEVICE BY USING AN IN SITU SURFACE MODIFICATION

BACKGROUND OF THE INVENTION

1. Field of the Invention

Generally, the present disclosure relates to microstructures, such as advanced integrated circuits, and, more particularly, to material systems including silicon oxide-based dielectrics having a low dielectric constant.

2. Description of the Related Art

In the fabrication of modern microstructures, such as integrated circuits, there is a continuous drive to improve performance in view of operational behavior and diversity of functions integrated in a single microstructure device. For this purpose, there is an ongoing demand to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, frequently, new materials may be required in order to not unduly offset any advantages that may be achieved by reducing the feature sizes of the individual components of microstructure devices, such as circuit elements and the like. For instance, upon shrinking the critical dimensions of transistors, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically two or more interconnections are required for each individual circuit element. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per $cm^2$ in the individual interconnect structures, despite the provision of a relatively large number of metallization layers, owing to the increased number of circuit elements per unit area. Consequently, well-established materials, such as aluminum, are being replaced by copper and copper alloys, i.e., materials with a significantly lower electrical resistivity and improved resistance to electromigration, even at considerably higher current densities, compared to aluminum.

The introduction of copper into the fabrication of microstructures and integrated circuits comes along with a plurality of severe problems residing in copper's characteristics to readily diffuse in silicon dioxide and other dielectric materials, as well as the fact that copper may not be readily patterned on the basis of well-established plasma assisted etch recipes. For example, based on conventional plasma assisted etch processes, copper may substantially not form any volatile etch byproducts such that the patterning of a continuous copper layer with a thickness that is appropriate for forming metal lines may not be compatible with presently available etch strategies. Consequently, the so-called damascene or inlaid process technique may typically be applied in which a dielectric material may be formed first and may be subsequently patterned in order to receive trenches and via openings, which may be subsequently filled with the copper-based material by using, for instance, electrochemical deposition techniques.

The reduced distance of metal lines may require a new type of dielectric material in order to reduce signal propagation delay, cross-talking and the like, which are typically associated with a moderately high capacitive coupling between neighboring metal lines. For this reason, increasingly, so-called low-k dielectric materials are being employed, which may generally have a dielectric constant of 3.0 or less, thereby maintaining the parasitic capacitance values in the metallization system at an acceptable level, even for the overall reduced dimensions in sophisticated applications.

Since silicon dioxide has been widely used in the fabrication of microstructure devices and integrated circuits, a plurality of modified silicon oxide-based materials have been developed in recent years in order to provide dielectric materials with a reduced dielectric constant on the basis of precursor materials and process techniques that may be compatible with the overall manufacturing process for microstructure devices and integrated circuits. For instance, silicon oxide materials with a moderately high amount of carbon and hydrogen, for instance referred to as SiCOH materials, have become a frequently used low-k dielectric material, which may be formed on the basis of a plurality of precursor materials, such as silane-based materials in combination with ammonium and the like, which may be applied by chemical vapor deposition (CVD) techniques and the like. In other cases, spin-on glass (SOG) materials may be modified so as to contain a desired high fraction of carbon and hydrogen, thereby providing the desired low dielectric constant.

In still other sophisticated approaches, the dielectric constant of these materials may be even further reduced by further reducing the overall density of these materials, which may be accomplished by incorporating a plurality of cavities of nano dimensions, also referred to as pores, which may represent gas-filled or air-filled cavities within the dielectric material, thereby obtaining a desired reduced dielectric constant. Although the permittivity of these dielectric materials may be reduced by incorporating carbon and forming a corresponding porous structure, which may result in a very increased surface area at interface regions connecting to other materials, the overall mechanical and chemical characteristics of these low-k and ultra low-k (ULK) materials may also be significantly altered and may result in additional problems during the processing of these materials.

For example, as discussed above, the dielectric material may typically have to be provided first and may be patterned so as to receive trenches and via openings, which may require the exposure of the sensitive low-k dielectric materials to various reactive process atmospheres. That is, the patterning of the dielectric material may typically involve the formation of an etch mask based on a resist material and the like followed by plasma assisted etch processes in order to form the trenches and via openings corresponding to the design rules of the device under consideration. Thereafter, usually cleaning processes may have to be performed in order to remove contaminants and other etch byproducts prior to depositing materials, such as conductive barrier materials and the like. Consequently, at least certain surface areas of the sensitive low-k dielectric materials may be exposed to plasma assisted processes, such as resist strip processes performed on the basis of an oxygen plasma, wet chemical reagents in the form of acids, aggressive bases, alcohols and the like, which may thus result in a certain degree of surface modification or damage. The low-k dielectric materials may typically be provided with a hydrophobic surface in order to avoid the incorporation of OH groups and the like, which may represent polarizable groups that may, therefore, "efficiently" respond to an electrical field, thereby significantly increasing the resulting permittivity of the surface portion of the material.

When exposing the sensitive low-k dielectric material to reactive process atmospheres, such as a plasma assisted etch process, aggressive wet chemical reagents and the like, the hydrocarbon groups of the hydrophobic surface area are greatly removed, thereby generating a plurality of non-saturated silicon bonds at the surface and within a certain interface layer, which may have a thickness of several nanometers to 20 nm or more. Consequently, after patterning the sensitive low-k dielectric material, for instance for forming via openings and trenches therein, any exposed surface areas thereof, and in particular the inner sidewall surface areas of the openings, may comprise a significant amount of dangling silicon bonds, which may "efficiently" react with moisture in the ambient atmosphere after the reactive etch process. Consequently, silanol groups (OH) may react with the non-saturated silicon bonds and may thus form a surface layer comprising highly polarized molecules, which in turn additionally result in adsorption of moisture and the like. Consequently, the interface layer of the sensitive low-k dielectric material may comprise a significant amount of polarizable molecules, which in turn may result in a significantly enhanced dielectric constant locally at the openings, which may thus lead to a significant parasitic capacitance of metal lines and vias to be formed on the basis of the previously etched openings. Furthermore, the silanol groups and the additional moisture adhering thereto may influence the further processing, for instance when forming barrier material and the like, which may result in a less reliable electromigration behavior and the like. Consequently, the general reduction of the dielectric constant of the dielectric materials of complex metallization layers may be offset to an enhanced degree due to the incorporation of silanol groups and moisture at an interface between the dielectric material and the metal lines and vias. Hence, great efforts are being made in providing silicon oxide-based low-k dielectric materials while avoiding or at least reducing the surface modifications caused by the patterning of the sensitive dielectric materials and the subsequent exposure to moisture containing process ambient.

In some conventional strategies, it has been suggested to selectively remove the damaged surface layer of the low-k dielectric materials on the basis of appropriate etch strategies, which may particularly remove the polarizable molecules without unduly damaging the hydrophobic nature of the resulting new surface layer. In this case, however, appropriate etch recipes may have to be applied without exposure of the resulting structure to any further aggressive process atmospheres in order to maintain the hydrophobic nature of the surface until the conductive barrier material and the like is deposited. This requires significant efforts in finding appropriate etch recipes, thereby contributing to increased process complexity. Additionally, the material removal may result in an increase of the critical dimensions of the metal lines and vias, which may be undesirable in view of enhanced packing density, since the increased critical dimensions have to be taken into consideration when designing the metallization system under consideration. On the other hand, a reduction of the initial critical dimension may not be compatible with the patterning capabilities in the metallization layer under consideration. Consequently, in other alternative approaches, the hydrophobic nature and thus the dielectric properties may be partially restored by applying a so-called low-k repair by means of silylation. In this case, appropriate chemicals react with the previously generated silanol groups on the dielectric surface, wherein the hydrogen atom may be substituted by an appropriate functional group including methyl groups, thereby providing a hydrophobic surface area for the further processing of the device and also re-establishing, to a certain degree, the low dielectric constant locally at the surface areas. In order to initiate the silylation reaction, it is, however, necessary to expose the device to the ambient atmosphere after the plasma based patterning process in order to saturate the dangling silicon bonds with the silanol groups. Although a plurality of the hydrogen atoms of the silanol groups may be replaced with appropriate functional groups containing hydrogen and carbon, nevertheless the oxygen atom of the silanol group may remain in the damaged surface region, thereby generally affecting the dielectric and chemical characteristics of the dielectric material. Moreover, typical silylation chemicals comprise molecules of large size, which may not efficiently diffuse into the surface of the damaged interface layer, which may thus result in moderately long process times and/or a reduced degree of substituting the hydrogen atoms with methyl group containing species. Furthermore, as discussed above, upon exposing the damaged sensitive low-k dielectric material to an ambient atmosphere in order to form the silanol groups, water molecules may also adsorb to the polarizable molecules and corresponding hydrogen bonds may strongly reduce the reaction of the silylation molecules with the silanol groups.

Consequently, although a surface treatment with chemical reagents may provide a certain degree of restoration of the hydrophobic surface conditions of porous silicon dioxide-based dielectric materials, the resulting interface formed between the restored dielectric material and the metal material may still have an increased dielectric constant and chemical characteristics may differ from the characteristics of the low-k dielectric material that has initially been formed.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques in which silicon dioxide-based low-k dielectric materials, which may have a porous structure, may be patterned on the basis of reactive process atmospheres, such as plasma assisted etch processes and the like, while a negative influence of the patterning process and any subsequent process steps with respect to the dielectric constant and the chemical characteristics may be significantly reduced. To this end, the non-saturated or dangling silicon bonds may be saturated to a high degree in a controlled process atmosphere without exposing the semiconductor device to an ambient atmosphere after the reactive patterning process. The saturation of the dangling silicon bonds may be accomplished on the basis of appropriate atomic or molecular species, which may enable an efficient substitution of these species in a further process stage, thereby sufficiently re-establishing, at least to a certain degree, the hydrophobic nature of the surface and thus also the dielectric characteristics. For example, the saturation of the dangling silicon bonds may be accomplished by using reactive species, such as hydrogen, nitrogen, carbon, chlorine, bromine, iodine, or also silanol groups, and the like, which may then be replaced by functional groups that may comprise methyl groups in order to restore the dielectric characteristics to a certain degree. In some illustrative embodiments, the replacement of the reactive species may be accomplished without exposing the device to ambient atmospheres, so that even silanol groups may be efficiently replaced on the basis of any appropriate molecules, wherein the OH group may entirely be substituted by a methyl group containing species. In other cases, the reactive atomic species may be efficiently replaced by, for instance, a single methyl group, thereby achieving the high degree of restoration of the initial dielectric characteristics of the low-k dielectric material. Furthermore, due to the controlled saturation of the dangling silicon bonds by means of the reactive species, generally chemicals including molecules of reduced size may be used during the restoration of the surface characteristics, thereby also enhancing the overall diffusion conditions so that the "repair" molecules may more efficiently penetrate the damaged surface layer.

One illustrative method disclosed herein relates to patterning a silicon and oxygen-containing low-k dielectric material formed above a substrate of a semiconductor device. The method comprises exposing the low-k dielectric material to a reactive etch atmosphere in a confined process environment, wherein the exposure to the reactive etch atmosphere results in the generation of non-saturated silicon atoms in an exposed surface layer of the low-k dielectric material. The method further comprises performing a first surface treatment prior to exposing the semiconductor device to ambient atmosphere, wherein the surface treatment results in the generation of reactive saturated silicon bonds by bonding a reactive species to at least some of the non-saturated silicon atoms. Additionally, the method comprises performing a second surface treatment so as to replace at least some of the reactive species with a substitute species comprising a hydrocarbon group.

A further illustrative method disclosed herein relates to forming a metallization system of a semiconductor device. The method comprises forming an opening in a low-k dielectric material by exposing the low-k dielectric material to a reactive etch atmosphere, wherein the low-k dielectric material comprises silicon, oxygen, carbon and hydrogen. The method further comprises performing a surface treatment on the low-k dielectric material that includes the opening so as to saturate dangling silicon bonds by a reactive species prior to exposing the semiconductor device to a moisture-containing ambient. The method further comprises replacing at least a portion of the reactive species by a substitute species containing a methyl group.

One illustrative semiconductor device disclosed herein comprises a low-k dielectric material formed above a substrate, wherein the low-k dielectric material comprises silicon, oxygen and methyl groups. The semiconductor device further comprises a metal region formed in the low-k dielectric material, wherein the metal region and the low-k dielectric material form an interface. Furthermore, the semiconductor device comprises an interface layer formed between the interface and a volume portion of the low-k dielectric material, wherein the interface layer comprises silicon, oxygen and methyl groups bonded to silicon. Moreover, the interface layer comprises a reactive species bonded to silicon so as to replace a methyl group, wherein the reactive species comprises one of hydrogen, nitrogen, carbon, chlorine, bromine, iodine and a silanol group.

BRIEF DESCRIPTION OF THE DRAWINGS

The disclosure may be understood by reference to the following description taken in conjunction with the accompanying drawings, in which like reference numerals identify like elements, and in which.

Figure 1A:
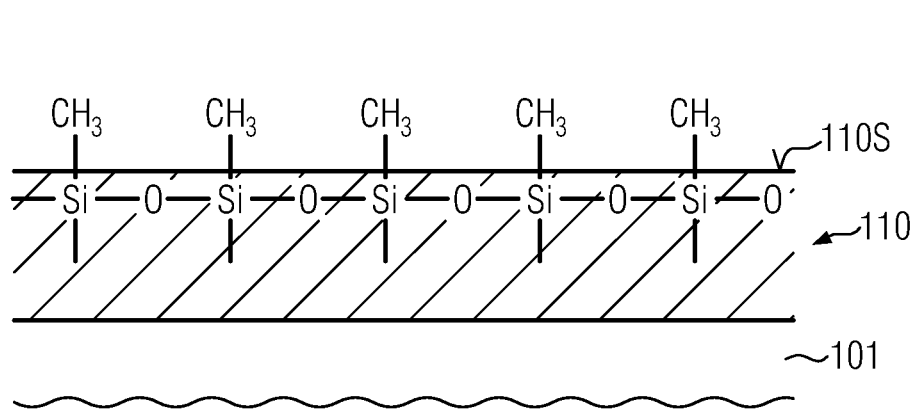
FIG. 1a schematically illustrates a cross-sectional view of a semiconductor device comprising a low-k dielectric material formed on the basis of silicon, oxygen, hydrogen and carbon, which may also have a moderately low dielectric constant at a surface thereof, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides process techniques and corresponding semiconductor devices in which superior characteristics of a silicon oxide-based low-k dielectric material may be obtained at an interface between the dielectric material and a metal region by re-establishing, at least to a certain degree, the initial dielectric and chemical characteristics. To this end, the low-k dielectric material may be exposed to a controlled and confined process atmosphere for performing a surface treatment in order to saturate dangling silicon bonds, which may have been created during the preceding patterning process. On the basis of the controlled and confined process environment, appropriate reactive species saturate the dangling silicon bonds, thereby providing uniform surface conditions in a damaged surface layer prior to exposing the semiconductor device to any moisture-containing ambient. Consequently, in a further advanced process stage, desired surface conditions may be re-established, at least to a certain degree, by replacing the reactive species with an appropriate substitute species that comprises a hydrocarbon group in order to obtain a low dielectric constant within the surface layer, while also providing a substantially hydrophobic surface characteristic in order to avoid undue chemical reactions with, for instance, water and the like during the further process. In some illustrative embodiments, the substitution of the reactive species bonded to the silicon atoms may be accomplished in a confined process atmosphere prior to exposing the device to a moisture-containing ambient, thereby providing well-controllable process conditions, which may thus result in very uniform characteristics of the resulting interface layer of the low-k dielectric material. The substitute species may generally be applied in the form of molecules of reduced size compared to conventional complex silylation chemicals, thereby enhancing the diffusion abilities so that the substitute species may penetrate deeply into the damaged surface layer. Consequently, generally, an increased amount of methyl group containing substitute species may be incorporated into the damaged low-k dielectric material compared to conventional approaches, thereby contributing to superior efficiency of the "repair" mechanism. In other cases, the further processing may be enhanced, since even exposure to the ambient atmosphere may be less critical prior to performing the actual repair step, since the reactive species bonded to the silicon atoms in the damaged surface layer may substantially suppress any undue surface reaction, for instance, with water and the like.

As a consequence, the present disclosure may be advantageously applied in the context of manufacturing strategies used in sophisticated micro-electronic fabrication techniques, in which silicon-based low-k dielectric materials, for instance in the form of porous material, may provide superior performance with respect to parasitic capacitance and the like. In this case, any damaged surface areas created during the patterning of the low-k dielectric material may be efficiently repaired, at least to a significant degree, by applying surface treatment as specified above, which, in some illustrative embodiments, may be formed as an in situ process in combination with the patterning process, thereby providing superior process efficiency, while avoiding the disadvantages of many conventional approaches, which may require the replacement of the damaged surface layer and/or require the application of complex silylation chemicals, which generally suffer from a reduced diffusion capability and a pronounced non-uniformity due to the preceding exposure to the ambient atmosphere.

It should be appreciated that the term "low-k" as used herein relates to the dielectric constant of a dielectric material having a value of 3.0 or less. Generally, the dielectric constant of a material may be determined by various well-established techniques, such as forming a capacitor structure of well-defined configuration, the response of which with respect to electrical signals may then be evaluated in order to determine the dielectric constant. Any such measurements are well established in the art and provide measurement results that are substantially identical within several percent. In this respect, the term "low-k" should be considered as a well-defined term.

FIG. 1*a* schematically illustrates a cross-sectional view of a semiconductor device 100, which may generally be understood as a device that may be fabricated and processed on the basis of micro-electronic manufacturing techniques. The semiconductor device 100 may comprise a substrate 101, which may represent any appropriate carrier material for forming thereabove a silicon oxide-based dielectric layer 110 with a dielectric constant of approximately 3.0 or less. Hence, in the above-defined sense, the dielectric layer 110 may also be referred to as a low-k dielectric material. The semiconductor device 100 may represent any device in which a low-k value of the layer 110 may be required, for instance with respect to electrical performance and the like. It should be appreciated that the dielectric layer 110 may have any appropriate thickness, such as several nanometers to several hundred nanometers or even thicker, depending on the specific configuration of the device 100 and the application of the layer 110 within the device 100. For example, the material of the layer 110 may be used as an efficient fill material for electrically insulating conductive regions of the device 100. As will be described later on in more detail, the dielectric material 110 may represent an interlayer dielectric material, for instance provided in a metallization system of the device 100. The layer 110 comprises silicon and oxygen in combination with carbon, hydrogen, wherein other components, such as nitrogen and the like, may also be incorporated, depending on the desired material characteristics and the desired dielectric constant.

The dielectric material 110 may be formed by any appropriate deposition process, such as a spin-on process, a chemical vapor deposition (CVD) process, for instance in the form of a plasma assisted CVD process or a thermally activated CVD process and the like. For example, a plurality of thermally activated CVD recipes may be applied, in which appropriate precursor materials, such as tetramethyoxysilane (TMOS) and/or tetraethoxysilane (TEOS) and the like, may be used for spin-on techniques and CVD processes. Furthermore, low pressure plasma enhanced CVD techniques may be applied, in which the creation of appropriate precursor ions and radicals may provide significantly enhanced flexibility in selecting an appropriate material composition, since many more reaction paths may be accomplished by providing radicals instead of using thermally activated CVD recipes. Furthermore, as indicated above, a further reduction of the material density and thus the dielectric constant may be accomplished by incorporating appropriate species or solvents into the deposition ambient, for instance into the liquid used for spin-on techniques or into the deposition atmosphere of CVD processes. These components may at least partially be driven out of the material as deposited by a corresponding treatment, for instance by heating the layer, performing a radiation treatment and the like. Consequently, a porous structure may be obtained in the layer 110, if required, which may result in an even further reduced dielectric constant, which, however, may also result in an increased surface area at a surface 110S of the layer 110 due to the presence of a plurality of cavities. Depending on the specific deposition conditions and possibly depending on any post-deposition treatments, the layer 110 may have a substantially hydrophobic behavior at its surface 110S, for instance, a methyl group ($CH_3$) may be bonded to corresponding silicon atoms at and near the surface 110S.

Figure 1B:
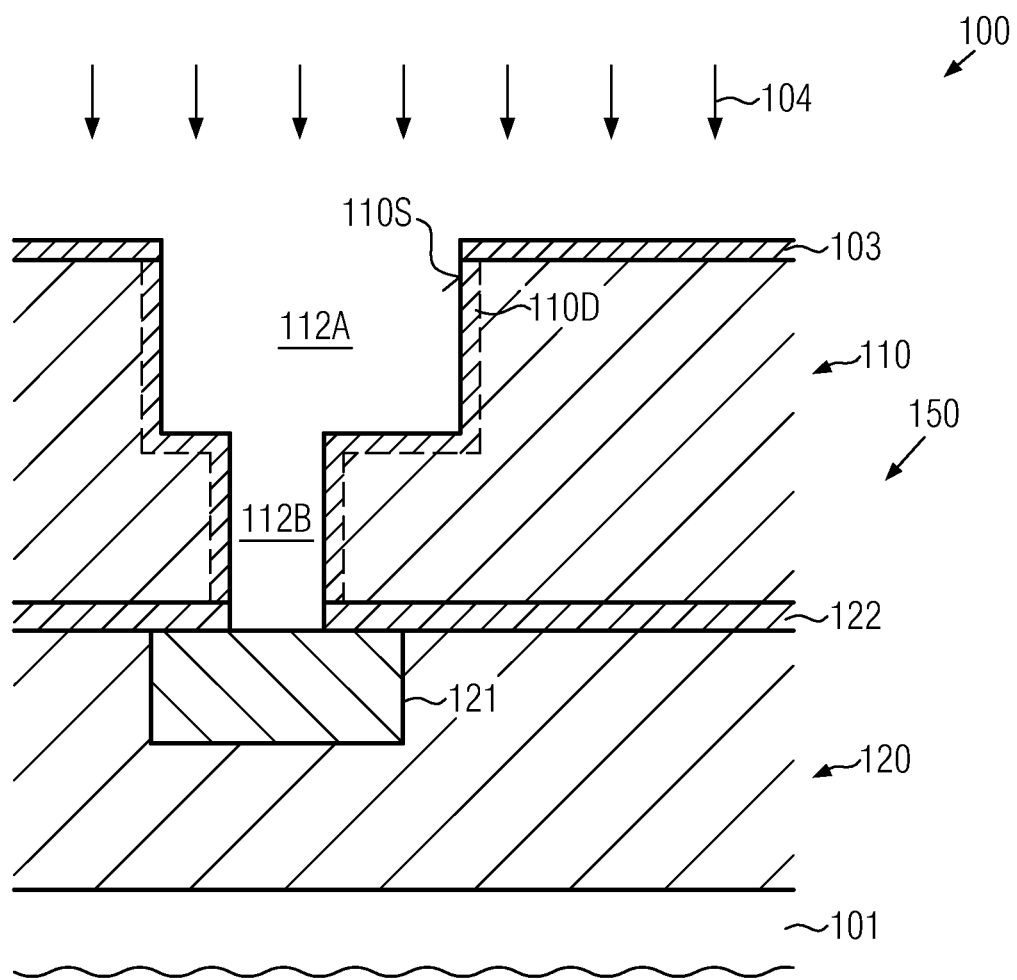
FIG. 1b schematically illustrates a cross-sectional view of the semiconductor device according to illustrative embodiments in which the low-k dielectric material is to be patterned in order to form a metallization system of the semiconductor device.

FIG. 1b schematically illustrates the semiconductor device 100 in cross-sectional view in a further advanced manufacturing stage. In the embodiment shown, a metallization system 150 may be provided above the substrate 101 in a more or less completed state. For example, a dielectric material layer 120, which may represent a low-k dielectric material or any other appropriate material, may be provided, in which corresponding metal regions, such as metal lines and the like, may be embedded. For convenience, a single metal region 121 is illustrated in FIG. 1b. Furthermore, a cap layer or etch stop layer 122 may be formed on the dielectric material layer 120 and the metal region 121, wherein the layer 122 may be comprised of silicon nitride, nitrogen-containing silicon carbide and the like. The layers 120 and 122 in combination with the metal region 121 may represent a metallization layer of the system 150. In the embodiment shown, the low-k dielectric layer 110 may be formed above the dielectric material 120 and may represent the dielectric material of a further metallization layer of the system 150. In the manufacturing stage shown, the device 100 may be exposed to a reactive process atmosphere 104, for instance in the form of a plasma assisted etch process, in order to appropriately pattern the low-k dielectric material 110 so as to form corresponding openings 112A, 112B, such as a trench opening in combination with a via opening. The patterning process 104 may be accomplished, for instance, on the basis of a hard mask material 103, such as titanium nitride and the like. During the patterning process 104, exposed surface areas 110S may thus be created, which may be in contact with the reactive process atmosphere of the process 104. Consequently, a damaged surface layer 110D may be formed, in which the surface characteristics may be significantly modified, as is also discussed above.

It should be appreciated that the semiconductor device 100 as shown in FIG. 1b may be formed on the basis of any well-established process technique for forming any circuit elements in and above the substrate 101 using well-established process strategies, wherein, as discussed above, in sophisticated applications, respective circuit elements may have to be formed on the basis of design rules of 50 nm and less. Thereafter, the layer 120 may be formed, for instance, on the basis of process techniques as described above with reference to the low-k dielectric material 110, followed by a patterning process, which may be similar to process techniques as will be described in the context of the layer 110. Thereafter, the metal region 121 may be formed by depositing any appropriate metal, for instance in the form of a conductive barrier material in combination with a highly conductive fill material, such as copper and the like. After the removal of any excess material, the layer 122 may be formed on the basis of any appropriate deposition technique. Next, the low-k dielectric material 110 may be deposited, as described above, and any appropriate process strategy may be applied so as to form an etch mask, for instance for defining the lateral size and position of the via opening 112B, followed by a further patterning process for providing the hard mask 103 used during the process 104.

Figure 1C:
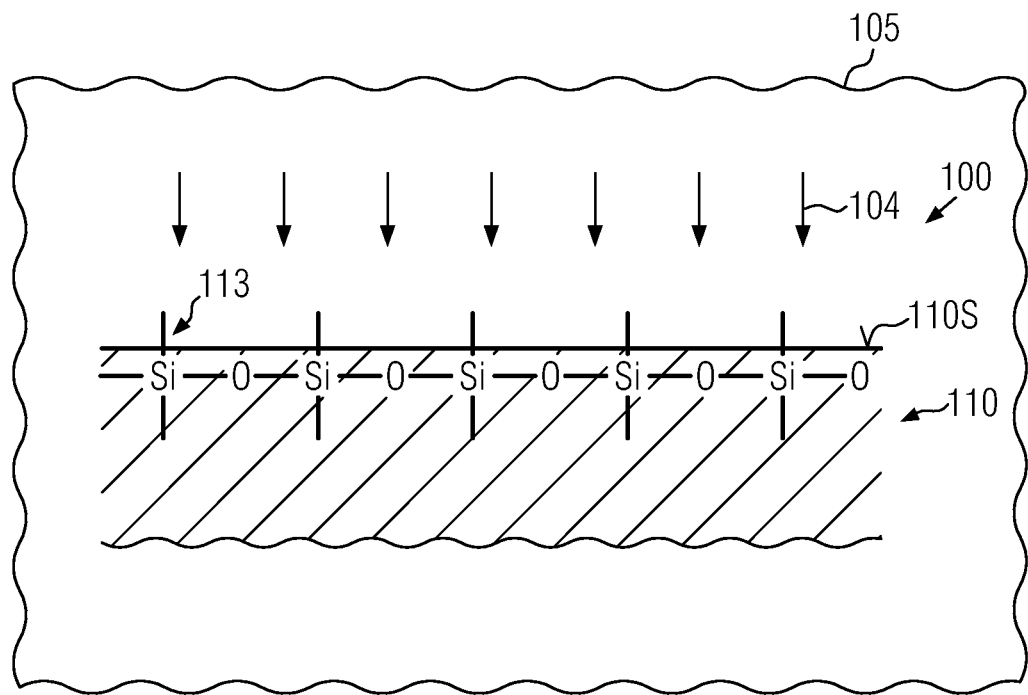
FIG. 1c schematically illustrates a cross-sectional view of the device when exposed to the reactive patterning process in a confined process environment.

FIG. 1c schematically illustrates the semiconductor device 100 during the patterning process 104. As shown, the device 100 may be treated in a confined process environment 105, which may represent an etch chamber of a plasma etch tool or any other appropriate process tool that is capable of providing the reactive process atmosphere for performing the etch process 104. As shown, during the process 104, material of the layer 110 may be removed, thereby forming the openings 112A, 112B (FIG. 1b), wherein finally a plurality of non-saturated or dangling bonds 113 may be generated at and near the exposed surface 110S. As discussed above, in this state, the surface 110S and any deeper lying areas, in which a significant amount of non-saturated silicon bonds may be present, may be highly reactive, and in particular in view of silanol groups, which may be formed upon exposure to a moisture-containing process ambient. In conventional approaches, however, a corresponding exposure to the ambient atmosphere may be required in view of applying silylation chemicals in a subsequent process stage in order to replace the hydrogen atom of the silanol group with an appropriate hydrocarbon group-containing species. Contrary to these conventional approaches, in the present disclosure, a surface treatment may be applied in a confined process environment, i.e., without exposing the device 100 to a clean room ambient, in order to saturate the dangling bonds 113 with appropriately selected reactive species.

Figure 1D:
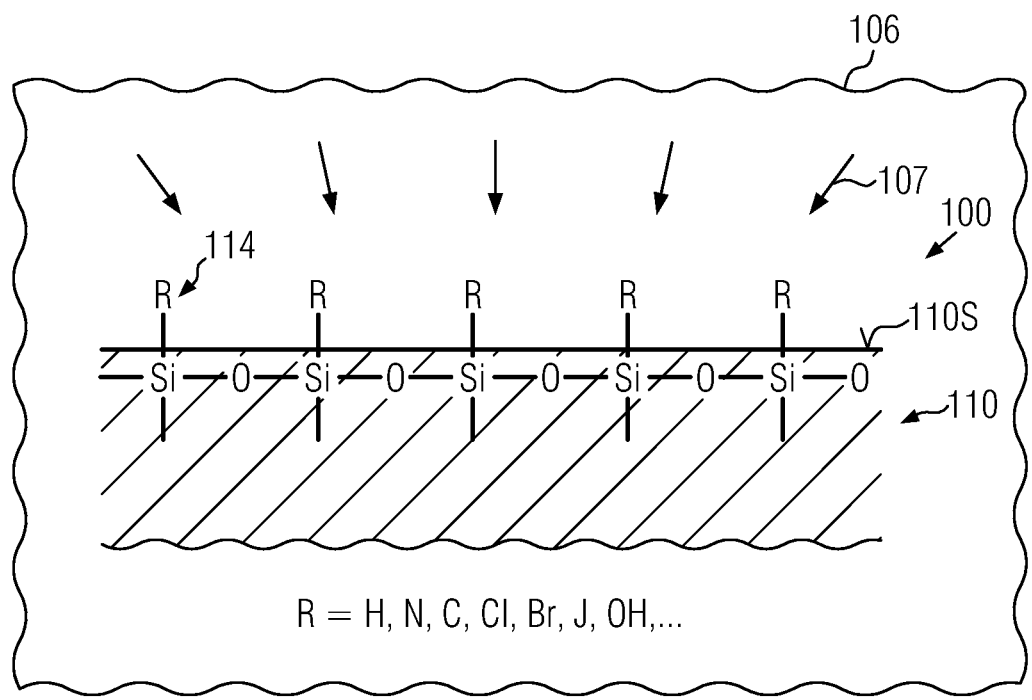
FIG. 1d schematically illustrates a cross-sectional view of the semiconductor device during a surface treatment performed in a confined process environment in order to saturate dangling silicon bonds, according to illustrative embodiments.

FIG. 1d schematically illustrates the device 100 during a surface treatment process 107, which may be performed in a confined process environment 106. In some illustrative embodiments, the confined process environment 106 may represent the environment 105 as used for the patterning process 104 described with reference to FIGS. 1b and 1c. In this case, the patterning process and the subsequent surface treatment 107 may be considered as an in situ process, since an intermediate exposure to ambient atmosphere may be avoided. It should be appreciated that the confined process environment 106 may also be established in a different process chamber compared to the previously used etch chamber, possibly within the same cluster tool, as long as an exposure to the ambient atmosphere during the corresponding transport activities is avoided. During the surface treatment 107, appropriate process parameters may be established, for instance by selecting an appropriate pressure and temperature, in order to initiate a chemical reaction so as to bond reactive species 114 to the non-saturated silicon atoms. For example, appropriate process gases may be applied to the environment 106 within a temperature range of room temperature to approximately 400° C. with a pressure of several militorr to several torr. In this manner, a plurality of reactive species 114 may be connected to the silicon atoms. For example, the reactive species 114 may comprise hydrogen, nitrogen, carbon, chlorine, bromine, iodine, silanol groups and the like. In some illustrative embodiments, the surface treatment 107 may be applied in the presence of a plasma, thereby creating responding radicals more efficiently, which may allow processing at lower temperatures and/or at lower pressures. It should be appreciated that appropriate process parameters may be readily established upon performing experiments, in which the degree of saturation may be determined for a plurality of different parameter settings. To this end, appropriate measurement techniques, such as Fourier transformed infrared spectroscopy (FTIR) and the like, may be applied, since these techniques may be highly sensitive to chemical bonds in a base material. Due to the saturation of the silicon bonds by means of the reactive species 114, which may represent, in some illustrative embodiments, single atomic species, superior surface conditions may be provided, thereby also providing a certain degree of insensitivity of the surface 110S during the further processing. Consequently, a relative uniform surface layer may be formed in the dielectric material 110, i.e., in the exposed surface portions that have been damaged during the previous patterning process, as described above with reference to FIG. 1b when referring to the surface layer 110D. Consequently, a subsequent repair process for re-establishing, at least to a certain degree, the initial hydrophobic surface configuration may be performed with superior efficiency compared to conventional strategies. That is, any appropriate molecular species may efficiently penetrate into the surface 110S and may thus efficiently replace the reactive species 114 in order to obtain the desired surface characteristics. For example, even when exposed to the ambient atmosphere, the adsorption of moisture may be significantly reduced due to the presence of the reactive species 114, which may, in some illustrative embodiments, be represented by a single atomic species.

Figure 1E:
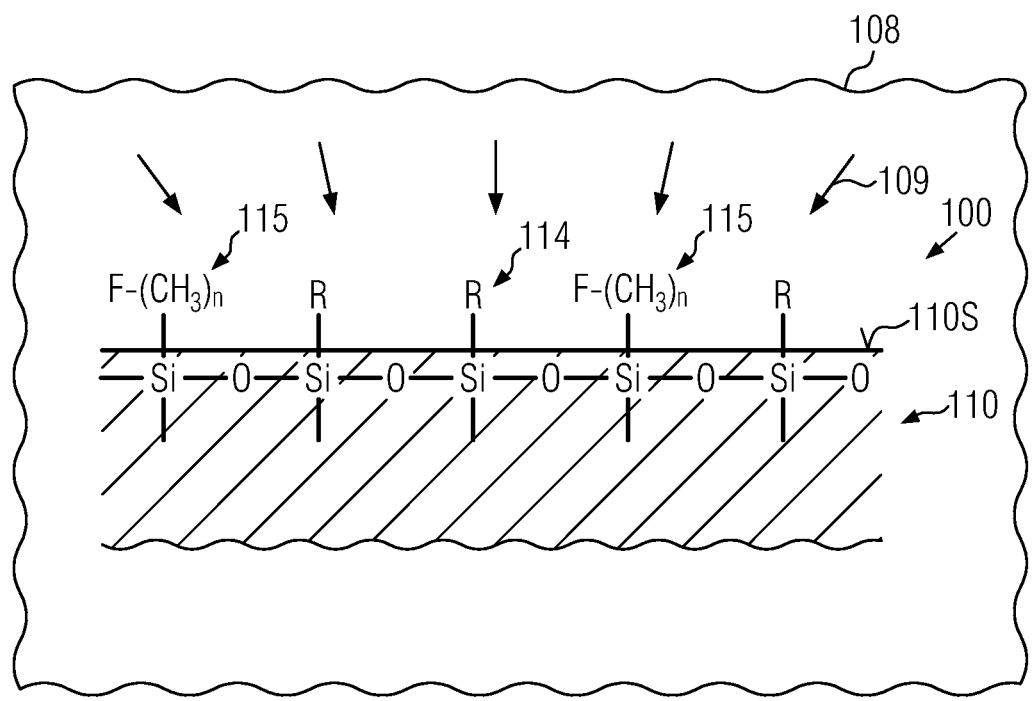
FIGS. 1e and 1f schematically illustrate cross-sectional views of the semiconductor device in further advanced manufacturing stages, in which at least a portion of the reactive species previously applied to saturate the dangling silicon bonds may be replaced with a functional species comprising one or more hydrocarbon groups for re-establishing the dielectric characteristics to a certain degree, according to illustrative embodiments.

FIG. 1e schematically illustrates the semiconductor 100 according to further illustrative embodiments, in which a further surface treatment 109 may be performed in order to replace at least some of the reactive species 114 with a substitute species 115, which may comprise hydrocarbon groups, such as methyl groups, in order to re-establish to a certain degree the hydrophobic nature of the surface 110S. In some illustrative embodiments, the surface treatment 109 may be performed in an appropriate confined process environment 108, without exposing the device 100 to ambient atmosphere. In this case, silanol groups may also be efficiently used as the reactive species 114, since the adsorption of additional moisture prior to the surface treatment 109 may be avoided. The surface treatment 109 may be performed on the basis of appropriate solutions or gases, in which the substitute species 115 may be provided in the form of any appropriate molecules. As discussed above, the presence of the reactive species 114 may enable the provision of molecules of reduced size compared to many conventional silylation chemicals in order to provide the substitute species 115, which, in the embodiment shown if FIG. 1E, is represented by any appropriate atomic species or molecule F having bonded thereon a plurality of methyl groups. When using molecules of reduced size, the diffusion thereof into the surface 110S may be enhanced, as discussed above, thereby providing a very efficient substitution mechanism, even in deeper areas of the damaged portion of the dielectric layer 110.

Figure 1F:
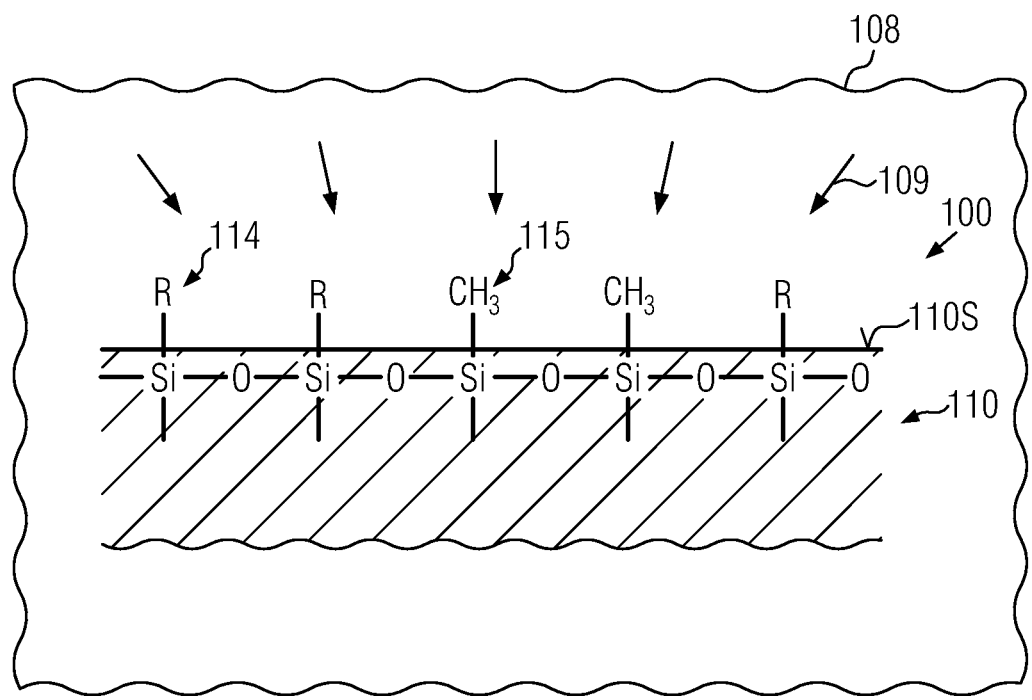

FIG. 1f schematically illustrates the device 100 during the surface treatment 109 according to illustrative embodiments in which some of the reactive species 114 may be directly replaced by a functional hydrocarbon group, such as a methyl group. In this manner, a significant portion of the damaged area of the layer 110 may be restored into the state, as may have been obtained after the deposition thereof. It should be appreciated that appropriate precursor gases for the treatment 109 may be provided in the form of any carbon and hydrogen containing gases or any responding solutions, which may be evaporated during the treatment 109. Appropriate materials and process conditions may be established by performing corresponding experiments using different materials and parameter settings and determining the process result on the basis of appropriate inspection technique, such as FTIR, in which resulting spectra may be efficiently analyzed with respect to the chemical bonds present in the material under consideration.

After the surface treatment 109, the processing may be continued by preparing the device for the deposition of conductive materials, such as a barrier material and the like. Due to the surface treatment 109, at least similar material characteristics may be re-established compared to the remaining portion of the layer 110, thereby enhancing the further processing, for instance in terms of performing additional cleaning processes, depositing materials and the like.

Figure 1G:
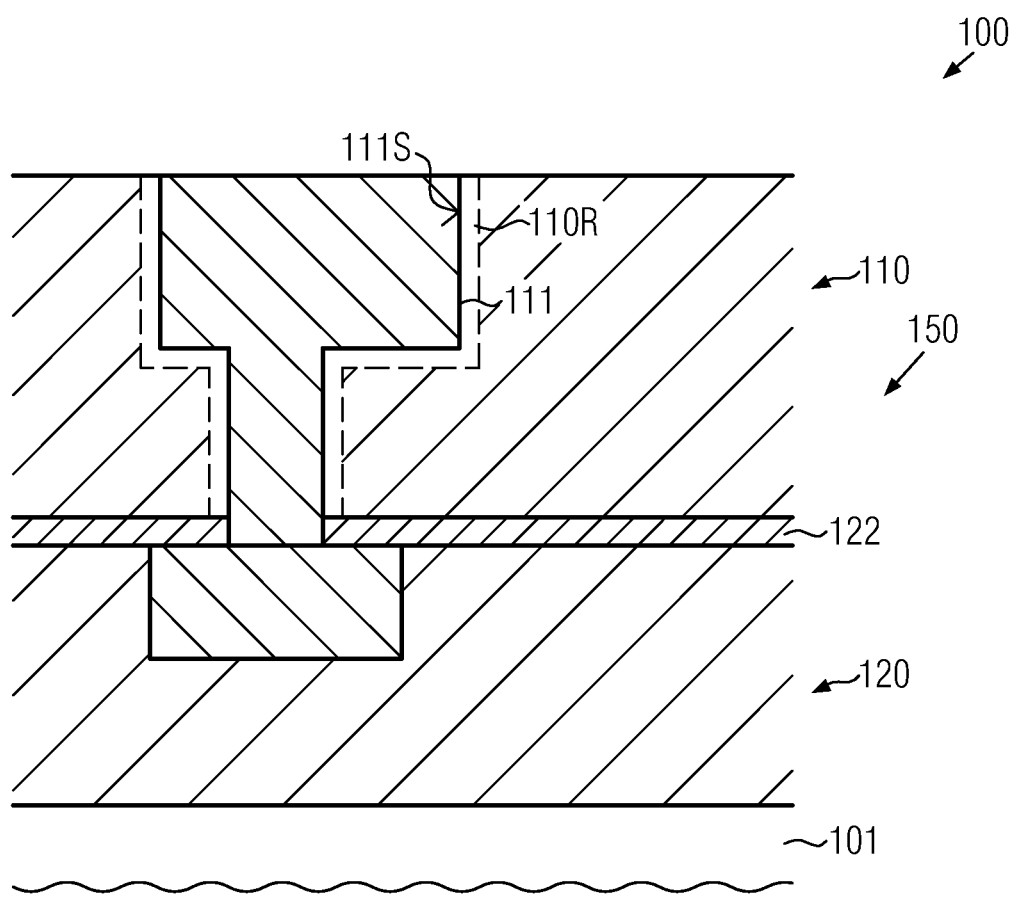
FIG. 1g schematically illustrates a cross-sectional view of the semiconductor device in a further advanced manufacturing stage, in which a metal region may be provided in the patterned low-k dielectric material, wherein superior dielectric and chemical characteristics may be obtained at an interface layer, according to further illustrative embodiments.

FIG. 1g schematically illustrates a cross-sectional view of the device 100 in a further advanced manufacturing stage. As illustrated, a metal region 111 may be formed in the dielectric layer 110 and may comprise any appropriate material or material systems, such as conductive barrier layers (not shown), in combination with any appropriate fill metal, such as copper and the like. Moreover, as illustrated, the metal region 111 may form an interface 111S with the dielectric layer 110, which may correspond to the surface 110S (FIG. 1B) having experienced a significant damage during the patterning of the layer 110. Due to the subsequent surface treatments, an efficient repair mechanism may be implemented, thereby forming an interface layer 110R, which may have substantially the same thickness as the damaged layer 110D of FIG. 1b. That is, as discussed above, the surface treatment 107 (FIG. 1d) results in an efficient saturation of any dangling silicon bonds within the damaged dielectric material, thereby also providing superior surface conditions for incorporating the actual "repair molecules," as discussed above. Consequently, generally, a superior penetration depth of the repair molecules into the damaged material portions of the layer 110 may be accomplished. Hence, the interface layer 110R, which may represent the restored dielectric material, may have a similar thickness compared to the initially damaged surface layer. Consequently, the interface layer 110R may comprise at least a certain amount of specific species bonded to silicon atoms, which may not be present within portions of the dielectric layer 110 outside of the interface layer 110R. For example, the interface layer 110R may comprise a certain concentration of silicon atoms bonded to hydrocarbon groups, such as methyl groups, wherein a concentration of silicon atoms bonded to reactive species, such as chlorine, bromine, iodine, nitrogen, carbon, hydrogen and the like, may be significantly greater and may even be a comparable order of magnitude compared to the concentration of silicon-hydrocarbon group bonds. In some illustrative embodiments, the concentration of the reactive species may be approximately 5% or more of a concentration of methyl groups in the interface layer 110R, wherein the concentration is to be understood as the number of reactive species relative to the number of methyl groups in a unit volume. Consequently, although significant damage may have been caused within the interface layer upon patterning the low-k dielectric material 110, a reduced overall dielectric constant may be re-established and also a desired hydrophobic surface characteristic may be established due to the process strategy as described above. Hence, the metal region 111 may be embedded in the interface layer 110R, which may have a comparable dielectric constant compared to the remaining portion of the dielectric layer 110.

With respect to forming the metal region 111, any appropriate manufacturing technique may be applied, as is also discussed above.

As a result, the present disclosure provides manufacturing techniques and corresponding semiconductor devices in which damaged surface areas of low-k dielectric materials may be restored to a certain degree on the basis of a surface treatment performed after the reactive patterning process without exposing the device to ambient atmosphere. To this end, appropriate reactive species may be used so as to saturate the dangling silicon bonds, which may be subsequently treated with any appropriate "repair" chemistry in order to substitute a significant amount of the reactive species. Contrary to conventional silylation strategies, a wide class of chemicals may be used, for instance chemicals including molecules of significantly lesser size compared to conventional silylation chemicals, thereby improving the diffusion conditions. Furthermore, the reactive species may be directly replaced by appropriate hydrocarbon groups, thereby, for instance, avoiding the incorporation of additional oxygen species, as is the case in many conventional silylation strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of patterning a silicon and oxygen containing low-k dielectric material formed above a substrate of a semiconductor device, the method comprising:
    exposing said low-k dielectric material to a reactive etch atmosphere in a confined process environment, said exposure to said reactive etch atmosphere resulting in the generation of non-saturated silicon atoms in an exposed surface layer of said low-k dielectric material;
    performing a first surface treatment prior to exposing said semiconductor device to ambient atmosphere, said first surface treatment resulting in the generation of reactive saturated silicon bonds by bonding a reactive species to at least some of said non-saturated silicon atoms; and
    performing a second surface treatment so as to replace at least some of said reactive species with a substitute species comprising a hydrocarbon group.

2. The method of claim 1, wherein said reactive etch atmosphere is established as a plasma assisted etch ambient.

3. The method of claim 1, wherein said first surface treatment is performed in a plasma assisted atmosphere.

4. The method of claim 1, wherein said first treatment is performed without plasma activation.

5. The method of claim 1, wherein said first and second surface treatments are performed without an intermediate exposure to the ambient atmosphere.

6. The method of claim 1, wherein said first surface treatment is performed in said confined process environment.

7. The method of claim 6, wherein said second surface treatment is performed in said confined process environment.

8. The method of claim 1, wherein said reactive species comprises at least one of a hydrogen atom, a nitrogen atom, a carbon atom, a chlorine atom, a bromine atom, an iodine atom and a silanol group.

9. The method of claim 1, wherein said substitute species comprises a methyl group.

10. The method of claim 9, wherein said substitute species is a single methyl group.

11. The method of claim 1, further comprising forming said silicon and oxygen containing low-k dielectric material as a portion of a metallization layer of said semiconductor device.

12. A method of forming a metallization system of a semiconductor device, the method comprising:
    forming an opening in a low-k dielectric material by exposing said low-k dielectric material to a reactive etch atmosphere, said low-k dielectric material comprising silicon, oxygen, carbon and hydrogen;
    performing a surface treatment on said low-k dielectric material including said opening so as to saturate dangling silicon bonds by a reactive species prior to exposing said semiconductor device to a moisture-containing ambient; and
    replacing at least a portion of said reactive species by a substitute species containing a methyl group.

13. The method of claim 12, wherein forming said opening comprises exposing said low-k dielectric material to said reactive etch atmosphere in a confined process environment and performing said surface treatment in said confined process environment.

14. The method of claim 12, wherein replacing at least a portion of said reactive species by a substitute species is performed without exposing said semiconductor device to ambient atmosphere after performing said surface treatment.

15. The method of claim 13, wherein replacing at least a portion of said reactive species by a substitute species is performed in said confined process environment.

16. The method of claim 12, wherein said reactive species comprises one of a hydrogen atom, a nitrogen atom, a carbon atom, a chlorine atom, a bromine atom, an iodine atom and a silanol group.

17. The method of claim 12, wherein said substitute species is a methyl group.

* * * * *